(12) United States Patent
Tai et al.

(10) Patent No.: US 11,667,522 B2
(45) Date of Patent: *Jun. 6, 2023

(54) MEMS PACKAGE COMPRISING MULTI-DEPTH TRENCHES

(71) Applicant: Taiwan Semiconductor Manufacturing Co., Ltd., Hsin-Chu (TW)

(72) Inventors: Wen-Chuan Tai, Hsinchu (TW); Fan Hu, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 104 days.

This patent is subject to a terminal disclaimer.

(21) Appl. No.: 17/109,405

(22) Filed: Dec. 2, 2020

(65) Prior Publication Data

US 2021/0078858 A1 Mar. 18, 2021

Related U.S. Application Data

(60) Continuation of application No. 16/934,255, filed on Jul. 21, 2020, now Pat. No. 10,865,102, which is a (Continued)

(51) Int. Cl.
*B81B 7/02* (2006.01)
*B81C 1/00* (2006.01)

(52) U.S. Cl.
CPC ............ *B81B 7/02* (2013.01); *B81C 1/00047* (2013.01); *B81C 1/00333* (2013.01);
(Continued)

(58) Field of Classification Search
None
See application file for complete search history.

(56) References Cited

U.S. PATENT DOCUMENTS

| 9,695,039 B1 | 7/2017 | Liu et al. |
| 2006/0012806 A1 | 1/2006 | Subirada et al. |

(Continued)

FOREIGN PATENT DOCUMENTS

| CN | 102795593 A | 11/2012 |
| CN | 104555896 A | 4/2015 |

(Continued)

OTHER PUBLICATIONS

Non-Final Office Action dated Aug. 2, 2019 for U.S. Appl. No. 15/822,538.

(Continued)

*Primary Examiner* — Nduka E Ojeh
(74) *Attorney, Agent, or Firm* — Eschweiler & Potashnik, LLC

(57) ABSTRACT

The present disclosure relates to a MEMS package having different trench depths, and a method of fabricating the MEMS package. In some embodiments, a cap substrate is bonded to a device substrate. The cap substrate comprises a cap substrate bonded to a device substrate. The cap substrate comprises a MEMS trench, a scribe trench, and an edge trench respectively recessed from at a front-side surface of the cap substrate. A stopper is disposed within the MEMS trench and raised from a bottom surface of the MEMS trench.

20 Claims, 11 Drawing Sheets

Related U.S. Application Data division of application No. 16/705,627, filed on Dec. 6, 2019, now Pat. No. 10,752,495, which is a continuation of application No. 15/822,538, filed on Nov. 27, 2017, now Pat. No. 10,556,790.

(52) U.S. Cl.
CPC ............ *B81B 2201/0235* (2013.01); *B81B 2201/0242* (2013.01); *B81B 2201/0257* (2013.01); *B81B 2201/0264* (2013.01); *B81B 2203/0315* (2013.01); *B81C 2201/013* (2013.01); *B81C 2201/0125* (2013.01); *B81C 2203/0109* (2013.01)

(56) References Cited

U.S. PATENT DOCUMENTS

| | | | |
|---|---|---|---|
| 2011/0309486 A1 | 12/2011 | Dalal et al. | |
| 2013/0043510 A1* | 2/2013 | Shu | B81C 1/00269 438/51 |
| 2014/0227816 A1* | 8/2014 | Zhang | H01L 21/56 438/48 |
| 2014/0248730 A1* | 9/2014 | Huang | H01L 24/03 438/50 |
| 2015/0298968 A1 | 10/2015 | Lushan et al. | |
| 2016/0046483 A1 | 2/2016 | Cheng et al. | |
| 2016/0130137 A1 | 5/2016 | Huang et al. | |
| 2016/0244325 A1 | 8/2016 | Cheng et al. | |
| 2017/0210618 A1 | 7/2017 | Chang et al. | |
| 2019/0161346 A1 | 5/2019 | Lee et al. | |

FOREIGN PATENT DOCUMENTS

| | | |
|---|---|---|
| CN | 104016298 A | 9/2015 |
| CN | 106938837 A | 7/2017 |

OTHER PUBLICATIONS

Notice of Allowance dated Nov. 1, 2019 for U.S. Appl. No. 15/822,538.
Non-Final Office Action dated Jan. 21, 2020 for U.S. Appl. No. 16/705,627.
Notice of Allowance dated Apr. 16, 2020 for U.S. Appl. No. 16/705,627.
Notice of Allowance dated Sep. 15, 2020 for U.S. Appl. No. 16/934,255.

* cited by examiner

MEMS PACKAGE COMPRISING MULTI-DEPTH TRENCHES

REFERENCE TO RELATED APPLICATIONS

This Application is a Continuation of U.S. application Ser. No. 16/934,255, filed on Jul. 21, 2020, which is a Divisional of U.S. application Ser. No. 16/705,627, filed on Dec. 6, 2019 (now U.S. Pat. No. 10,752,495, issued on Aug. 25, 2020), which is a Continuation of U.S. application Ser. No. 15/822,538, filed on Nov. 27, 2017 (now U.S. Pat. No. 10,556,790, issued on Feb. 11, 2020). The contents of the above-referenced Patent Applications are hereby incorporated by reference in their entirety.

BACKGROUND

Microelectromechanical systems (MEMS) devices, such as accelerometers, pressure sensors, and microphones, have found widespread use in many modern day electronic devices. For example, MEMS accelerometers are commonly found in automobiles (e.g., in airbag deployment systems), tablet computers, or in smart phones. For some applications, various MEMS devices need to be integrated into one MEMS package; these may include some MEMS sensors requiring different cavity depths.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
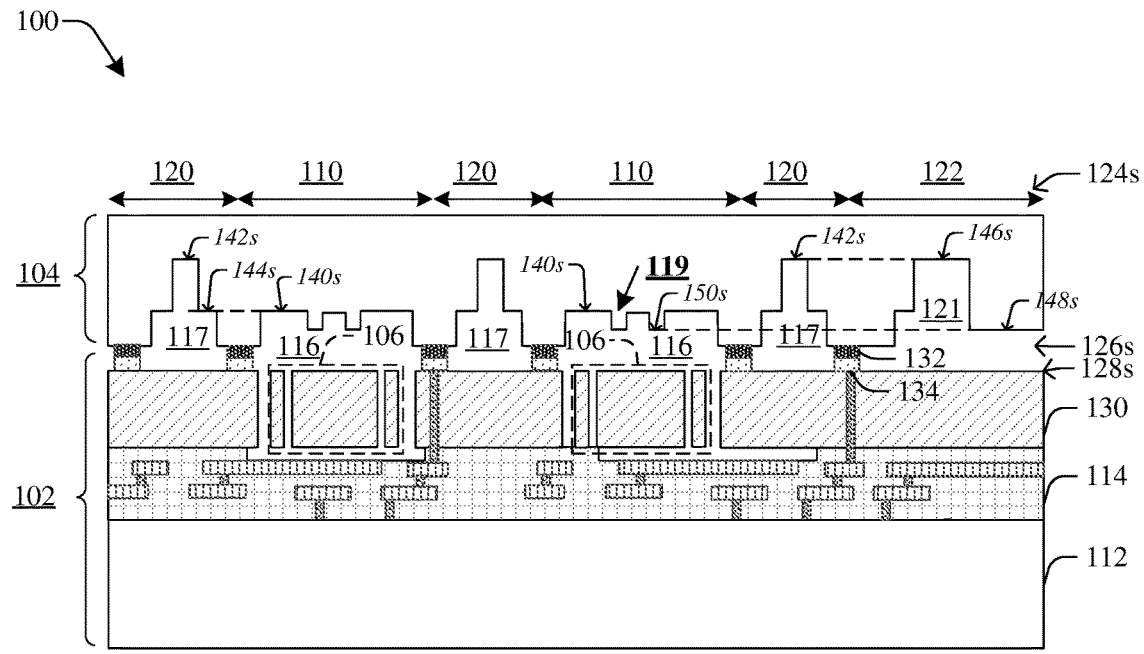
FIG. 1 illustrates a cross-sectional view of some embodiments of a microelectromechanical systems (MEMS) package.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "First", "second", "third", etc. are not intended to be descriptive of the corresponding element. Therefore, "a first dielectric layer" described in connection with a first figure may not necessarily corresponding to a "first dielectric layer" described in connection with another figure.

Multiple MEMS devices may be integrated onto a same integrated chip in recent generations of MEMS ICs. For example, motion sensors are used for motion-activated user interfaces in consumer electronics such as smartphones, tablets, gaming consoles, smart-TVs, and in automotive crash detection systems. To capture a complete range of movements within a three-dimensional space, motion sensors often utilize an accelerometer and a gyroscope in combination. The accelerometer detects linear movement. The gyroscope detects angular movement. To meet consumer demand for low cost, high quality, and small device footprint, the accelerometer and the gyroscope can be integrated together on the same substrate. The accelerometer and the gyroscope utilize different rooms for movement and thus need different cavity depths. One way to fabricate cavities with different depths on the same substrate is to use a series of photolithography and patterning processes. However, after patterning and forming a trench with a first depth in the substrate, the substrate surface becomes non-planar. The subsequent patterning process to form a second trench with a second depth becomes challenging as it is hard to form and pattern a desired photoresist masking layer on the uneven topography of the substrate surface (e.g. insufficient coating or voids may be formed within deep trenches). The case becomes even worse as some additional depth structures such as movement stoppers or subscribe trenches are needed.

The present disclosure is related to a MEMS package having a cap substrate with different trench depths, and a method of fabricating the MEMS package. In some embodiments, a cap substrate is provided having a first device region and a scribe line region defined on the cap substrate. A first trench in the first device region and a scribe trench in the scribe line region are formed at a front side of the cap substrate. Then, a hard mask is formed and patterned over the cap substrate to cover a portion of a bottom surface of the first trench while to expose a remaining portion of the bottom surface of the first trench. Then, with the hard mask in place, an etch is performed to the cap substrate such that the uncovered portion of the bottom surface of the first trench is recessed while the covered portion of the bottom surface of the first trench is non-altered to form a stopper within the first trench. Then, the front side of the cap substrate is bonded to a device substrate, enclosing the first trench over a first MEMS device. Thus, by forming a first trench and then forming and patterning a hard mask within the first trench to prepare for a further etched back (e.g. to form a stopper), different trench depths are formed without applying a masking layer (e.g. a photoresist masking layer) within deep trenches. Comparing to an alternative method to form the stopper by a patterning process performed later in the fabrication process, a required aspect ratio of the patterning openings is reduced. Thereby, an optimized patterning result can be achieved and the fabrication quality is improved.

FIG. 1 shows a cross-sectional view 100 of a MEMS package according to some embodiments. The MEMS package comprises a device substrate 102 and a cap substrate 104 bonded together. In some embodiments, the device substrate 102 may comprise a semiconductor substrate 112 having active elements (e.g., a transistor), an interconnect layer 114 having metallization planes and via interconnects disposed within an inter-metal dielectric (IMD) material, and a MEMS substrate 130 having first MEMS device 106. The cap substrate 104 comprises a device region 110 and a scribe line region 120 defined on the cap substrate 104. The cap substrate 104 encloses a first cavity 116 overlying the first MEMS device 106 within the device region 110 and a scribe trench 117 within the scribe line region 120. In some embodiments, a stopper 119 is raised from a bottom surface 140s of the first cavity 116 to a position within the first cavity 116 and vertically lower than a front-side surface 126s of the cap substrate 104. The scribe trench 117 has a bottom surface 142s located at a position within the cap substrate that is deeper than the bottom surface 140s of the first cavity 116. In some embodiments, the scribe trench 117 may comprise a peripheral portion having a depth substantially equal to the depth of the first cavity 116, i.e., a surface 144s of the peripheral portion can be substantially coplanar to the bottom surface 140s of the first cavity 116. In some embodiments, the cap substrate 104 may further comprise a wafer edge trench 121 disposed within a wafer edge region 122 defined on the boundary region of the cap substrate 104. The wafer edge trench 121 may comprise a bottom surface 146s that may locate at a substantially same depth with the bottom surface 142s of the scribe trench 117. The wafer edge trench 121 may further comprise peripheral portion 148s that may locate at a substantially same depth with a top surface 150s of the stopper 119. As an example, the first cavity 116, the scribe trench 117, and the wafer edge trench 121 can be formed by a series of fabrication processes shown in FIGS. 4-10, which are described in more detail later.

Figure 2:
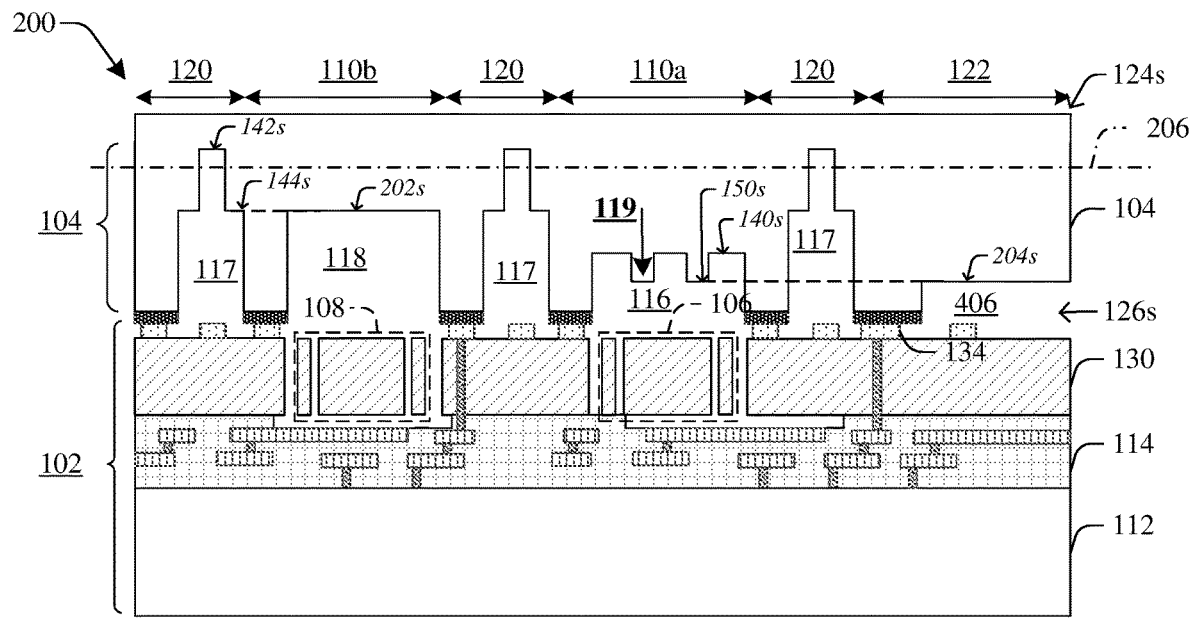
FIG. 2 illustrates a cross-sectional view of some alternative embodiments of a MEMS package.

FIG. 2 shows a cross-sectional view 200 of a MEMS package according to some alternative embodiments. The MEMS package comprises a first MEMS device 106 and a second MEMS device that is respectively enclosed by a first cavity 116 and a second cavity 118 having different depths. A scribe trench 117 has a bottom surface 142s located at a position within the cap substrate that is deeper than a bottom surface 202s of the second cavity 118. In some embodiments, the scribe trench 117 may comprise a peripheral portion having a depth substantially equal to the depth of the first cavity 116, i.e., a surface 144s of the peripheral portion can be substantially coplanar to the bottom surface 202s of the second cavity 118. A bottom surface 140s of the first cavity 116 may locate at a position within the cap substrate 104 that is vertically shallower than the 202s of the second cavity 118. In some embodiments, the cap substrate 104 may further comprise a wafer edge trench 406 having a bottom surface 204s that may locate at a substantially same depth with a top surface 150s of the stopper 119. As an example, the first cavity 116, the scribe trench 117, and the wafer edge trench 406 can be formed by a series of fabrication processes shown in FIGS. 12-21, which are described in more detail later. It is understood that some features of the MEMS package described above for FIG. 1 can be incorporated into FIG. 2, and is not repeated here for simplicity reason.

Figure 3:
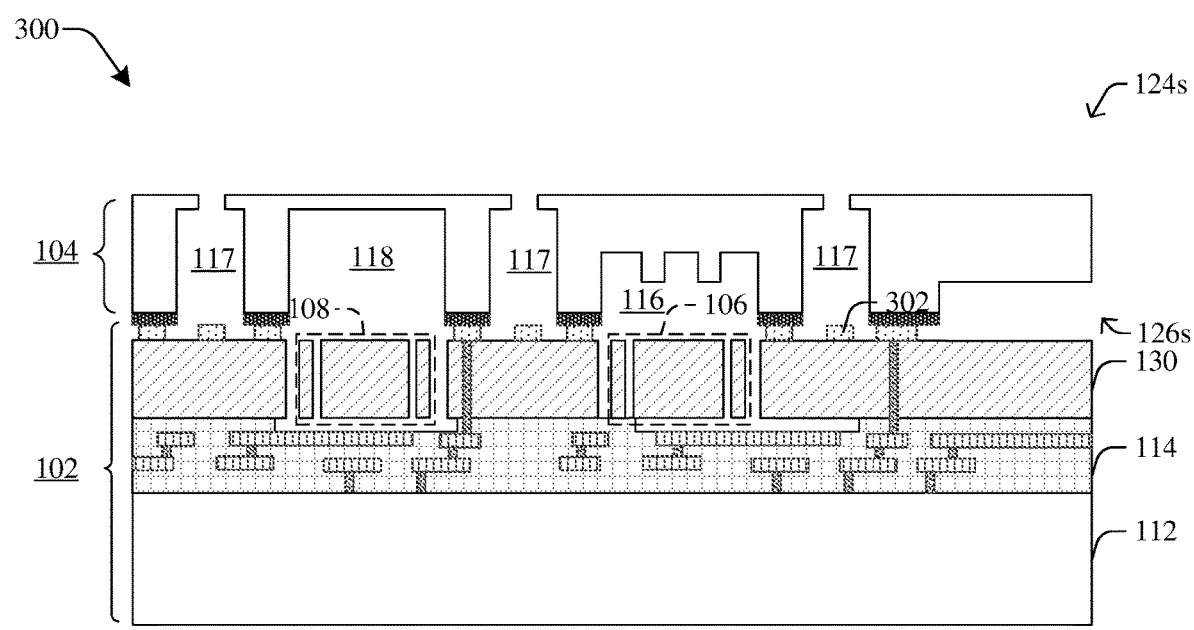
FIG. 3 illustrates a cross-sectional view of some alternative embodiments of a MEMS package.

FIG. 3 shows a cross-sectional view of a MEMS package according to some other embodiments. In some embodiments, the MEMS package shown above in FIG. 2 may be subsequent thinned (e.g. from the back-side surface 124s to a position showed by dash-dotted line 206). The scribe trench 117 may be opened, and a test feature 302 may be exposed for wafer level testing. A singulation process (e.g. dicing) may be subsequently performed.

FIGS. 4-10 show a series of cross-sectional views that collectively depict the formation of a MEMS package according to some embodiments.

Figure 4:
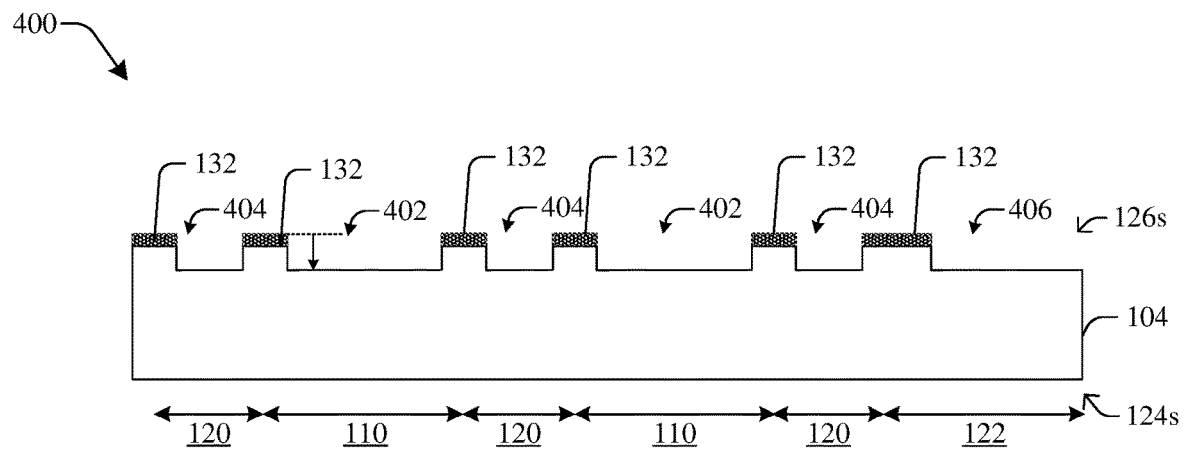
FIGS. 4-10 illustrate a series of cross-sectional views of some embodiments of a MEMS package at various stages of manufacture.

As shown in FIG. 4, a cap substrate 104 is prepared. A device region 110, a scribe line region 120 are defined on the cap substrate 104. The scribe line region 120 may be defined surrounding the device region 110. A wafer edge region 122 may be defined at a boundary area of the cap substrate 104. In some embodiments, a bonding layer 132 is disposed on a front-side surface 126s of the cap substrate 104. The bonding layer 132 and the cap substrate 104 are patterned to form a first trench 402 in the device region 110, a scribe trench 404 in the scribe line region 120, and a wafer edge trench 406 in the wafer edge region 122. The first trench 402, the scribe trench 404, and the wafer edge trench 406 are formed to have a substantially same depth vertically relative to a front-side surface 126s of the cap substrate 104. In various embodiments, the cap substrate 104 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith. As examples, the bonding layer 132 can be made of metals such as aluminum (Al), germanium (Ge), gold (Au), copper (Cu), Tin (Sn) or alloys.

Figure 5:
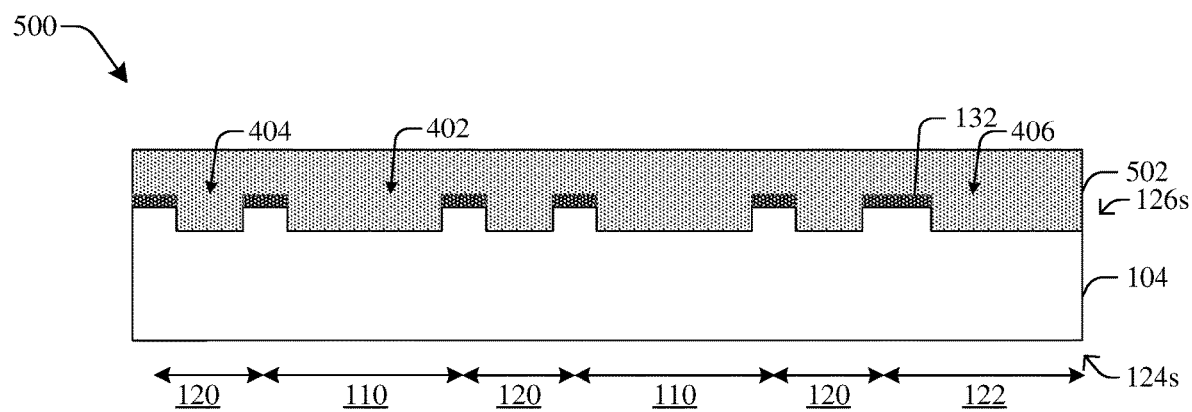

As shown in FIG. 5, a hard mask 502 is formed on the cap substrate 104. The hard mask 502 may be formed by deposition techniques and may comprise silicon dioxide, silicon nitride, other dielectric materials, or metal depending on applications. The hard mask 502 is formed to fill the first trench 402, the scribe trench 404, and the wafer edge trench 406, and to extend over the bonding layer 132.

Figure 6:
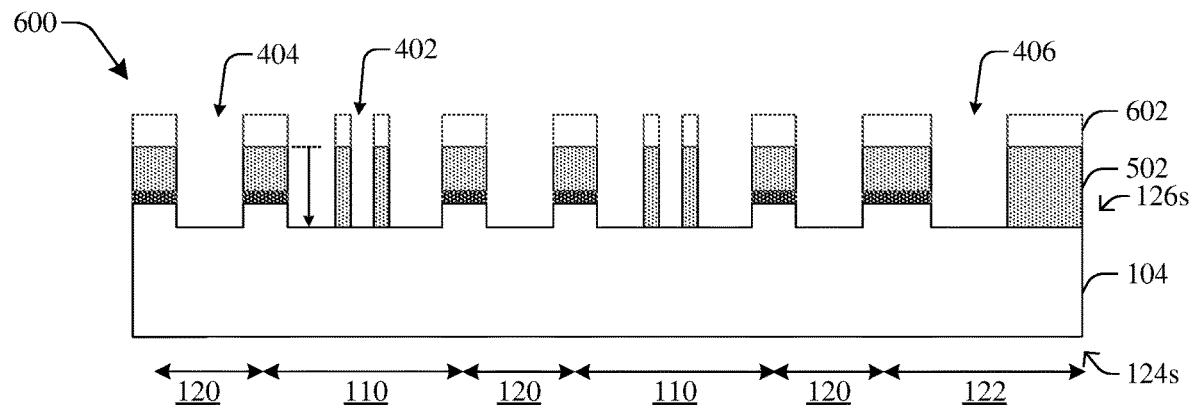

As shown in FIG. 6, the hard mask 502 is patterned. As a result of the patterning, a portion of a bottom surface of the first trench 402 is covered (to prepare for a subsequent stopper formation) while a remaining portion of the bottom surface of the first trench 402 is not covered. The hard mask 502 in the scribe trench 404 and a portion of the wafer edge trench 406 are removed by the patterning process. In some embodiments, the hard mask 502 is patterned by an etching process according to a photoresist masking layer 602, which is formed on the hard mask 502 and then patterned by a photolithography process. In various embodiments, the etching process may comprise a wet etch or a dry etch (e.g., a plasma etch with tetrafluoromethane (CF4), sulfur hexafluoride (SF6), nitrogen trifluoride (NF3), etc.). The photoresist masking layer 602 will be substantially removed after the etching processes.

Figure 7:
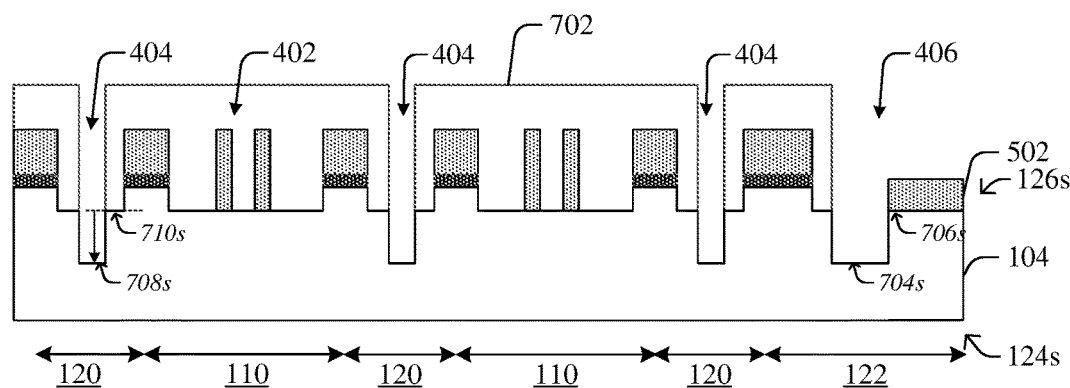

As shown in FIG. 7, a photoresist masking layer 702 is formed on the hard mask 502 and then patterned by a photolithography process to expose at least a portion of the bottom surface of the scribe trench 404 and the wafer edge trench 406. An etch is then performed to the scribe trench 404 to lower a bottom surface of the scribe trench 404. In some embodiments, a central portion 708s of the bottom surface of the scribe trench 404 is recessed while a peripheral portion 710s of the bottom surface of the scribe trench 404 is covered by a photoresist masking layer 702. In some embodiments, a portion 704s of the bottom surface of the wafer edge trench 406 is recessed while a peripheral portion 706s of the bottom surface of the wafer edge trench 406 is covered by the photoresist masking layer 702. In some alternative embodiments not shown in FIG. 7, the entire or a majority portion of the scribe trench 404 can be recessed by patterning the photoresist masking layer 702 to expose the scribe trench 404.

Figure 8:
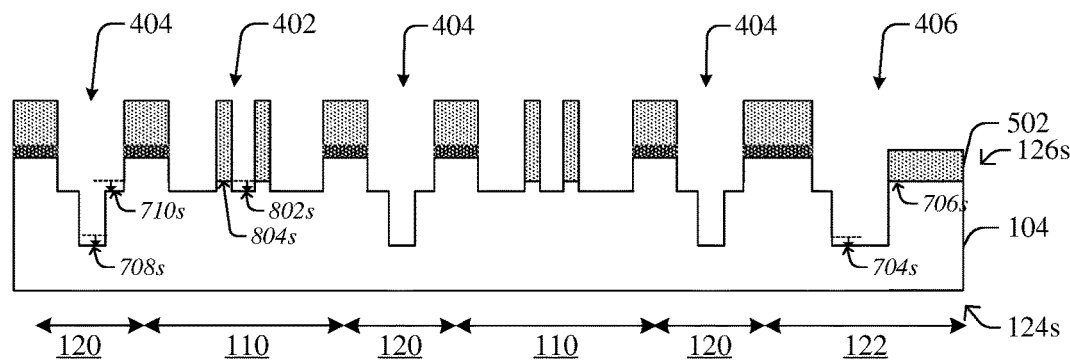

As shown in FIG. 8, a blanket etch back process is performed to the cap substrate 104 to lower bottom surfaces of the first trench 402, the scribe trench 404, and the wafer edge trench 406 that are not covered by the hard mask 502. The etch back process may be a dry etch using an etchant that is highly selective to the material of the cap substrate 104 than the material of the hard mask 502. As a result, the uncovered portion 802s of the bottom surface of the first trench 402, the central portion 708s and the peripheral portion 710s of the bottom surface of the scribe trench 404, and the portion 704s of the bottom surface of the wafer edge trench 406 are recessed, while the covered portion 804s (covered by the hard mask 502) of the bottom surface of the first trench 402 and the portion 704s of the bottom surface of the wafer edge trench 406 are non-altered. By patterning and lowering the scribe trench 404 first (shown in FIG. 7), and followed by a blanket etch to further lower the scribe trench 404 and the first trench 402 together (shown in FIG. 8), the scribe trench 404 and the first trench 402 are formed having different depths. Comparing to an alternative method to etch the scribe trench 404 and the first trench 402 by separate patterning processes to target depths, a required aspect ratio of the patterning openings is reduced. Also, the work piece has a less height variation at the stage shown in FIG. 7 than a later stage. Thereby, an optimized patterning result can be achieved.

Figure 9:
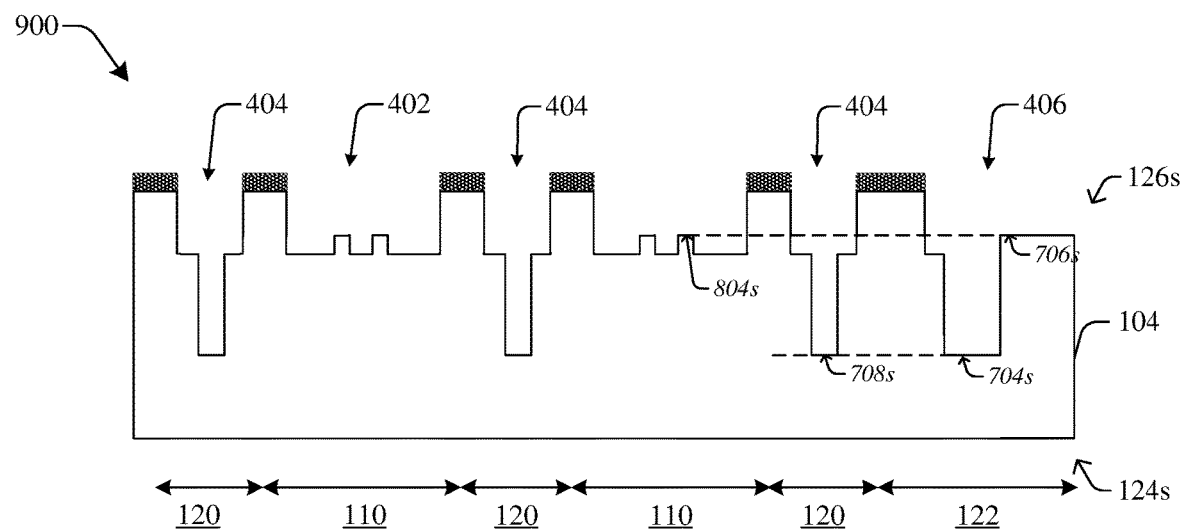

As shown in FIG. 9, the hard mask 502 is removed by a series of etching processes that may comprise dry etching or wet etching. As a result of the blanket etch back process of FIG. 8, the central portion 708s of the scribe trench 404 and the portion 704s of the wafer edge trench 406 may locate at a substantially same depth within the cap substrate 104. The peripheral portion 706s of the wafer edge trench 406 and the covered portion 804s of the first trench 402 may locate at a substantially same depth within the cap substrate 104.

Figure 10:
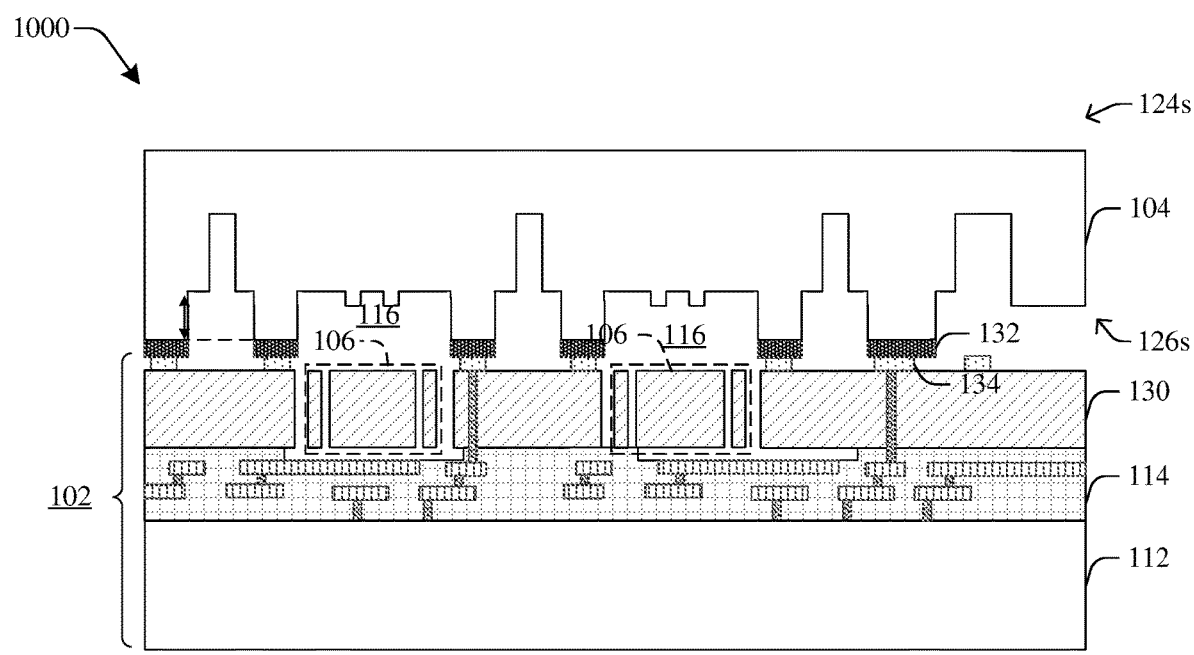

As shown in FIG. 10, the cap substrate 104 is flipped over and bonded to a device substrate 102. For example, the bonding layer 132 of the cap substrate 104 are bonded by a eutectic bonding process to the corresponding bonding elements 134 of the device substrate 102, such that the device substrate 102 and the cap substrate 104 are physically and electrically connected. The device substrate 102 may be prepared by providing a semiconductor substrate 112, which has been prepared through one or more fabrication processes. For example, the semiconductor substrate 112 includes one or more active elements. A series of metallization planes and via interconnects are disposed within an IMD layer 114 formed over an upper surface of the semiconductor substrate 112. A MEMS substrate 130 comprising the first and second MEMS devices 106, 108 is bonded to the semiconductor substrate 112 through IMD layer 114 to form a device substrate 102. For example, the MEMS substrate 130 can be bonded to the IMD layer 114 by a fusion bonding process. In some embodiments, a fusion bonding is achieved between the IMD layer 114 comprising $SiO_2$ and the MEMS substrate 130 comprising Si. In some embodiments, the MEMS substrate 130 and/or the semiconductor substrate 112 is thinned down to reduce the thickness thereof after fusion bonding.

Figure 11:
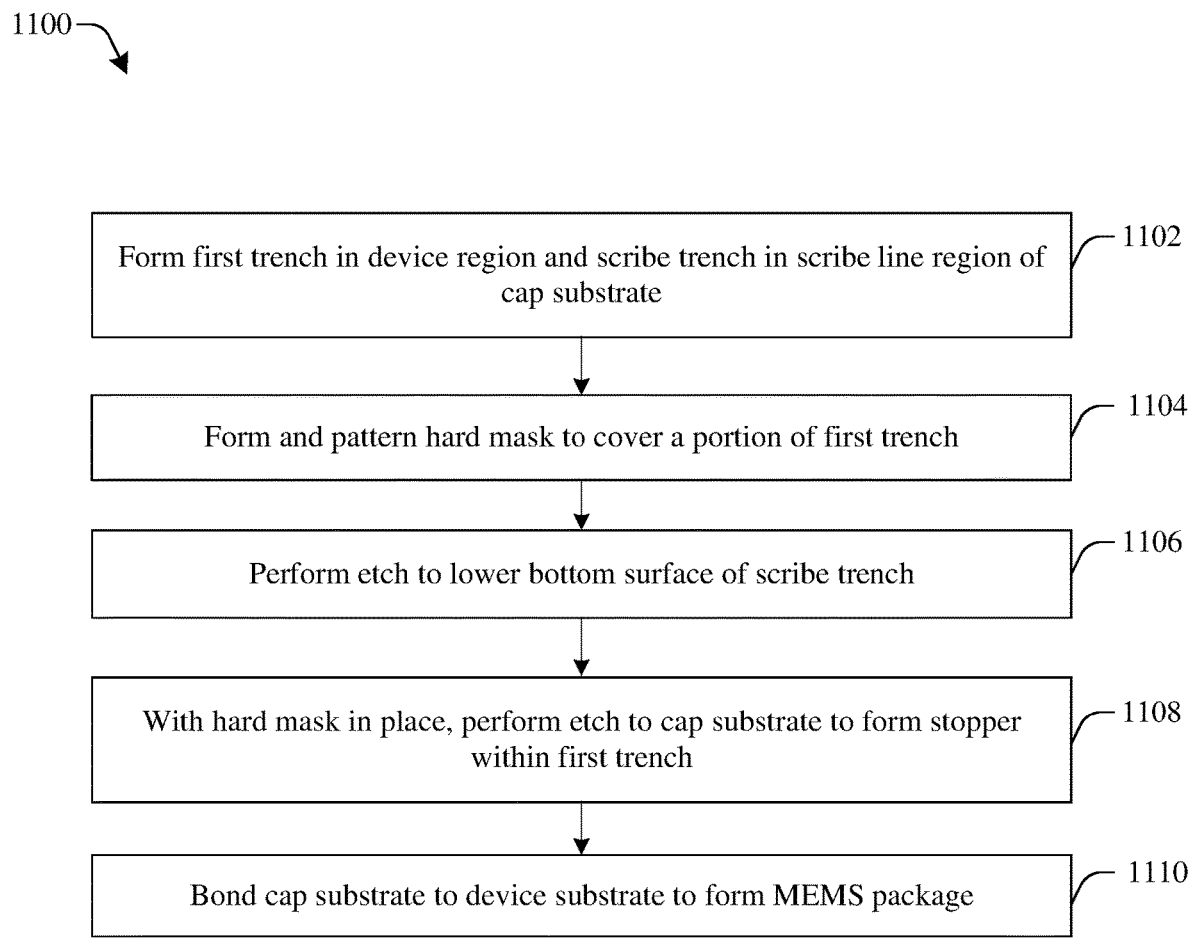
FIG. 11 illustrates a flow diagram of some embodiments of a method for manufacturing a MEMS package.

FIG. 11 shows a flow diagram of a method 1100 for manufacturing a MEMS package according to some embodiments. The MEMS package comprises two MEMS devices with different cavity depths. Examples of the MEMS package are shown in FIG. 1.

While disclosed methods (e.g., methods 1100) are illustrated and described below as a series of acts or events, it will be appreciated that the illustrated ordering of such acts or events is not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases. Although the method 1100 is described in relation to FIGS. 4-10, it will be appreciated that the method 1100 is not limited to the structures disclosed in FIGS. 4-10, but instead may stand alone independent of the structures disclosed in FIGS. 4-10.

At action 1102, a first trench is formed in a device region and a scribe trench is formed in scribe line region of a cap substrate. FIG. 4 shows a cross-sectional view corresponding to action 1102 according to some embodiments.

At action 1104, a hard mask is formed and patterned to cover a portion of the first trench. FIGS. 5-6 show cross-sectional views corresponding to action 1104 according to some embodiments.

At action 1106, an etch is performed to lower a bottom surface of the scribe trench. FIG. 7 shows a cross-sectional view corresponding to action 1106 according to some embodiments.

At action 1108, with the hard mask in place, an etch is performed to the cap substrate to form a stopper within the first trench. FIGS. 8-9 show cross-sectional views corresponding to action 1108 according to some embodiments.

At action 1110, the cap substrate is bonded to a device substrate to form the MEMS package. FIG. 10 shows a cross-sectional view corresponding to action 1110 according to some embodiments.

FIGS. 12-22 show a series of cross-sectional views that collectively depict the formation of a MEMS package according to some embodiments. The MEMS package comprises at least two MEMS devices with different cavity depths.

Figure 12:
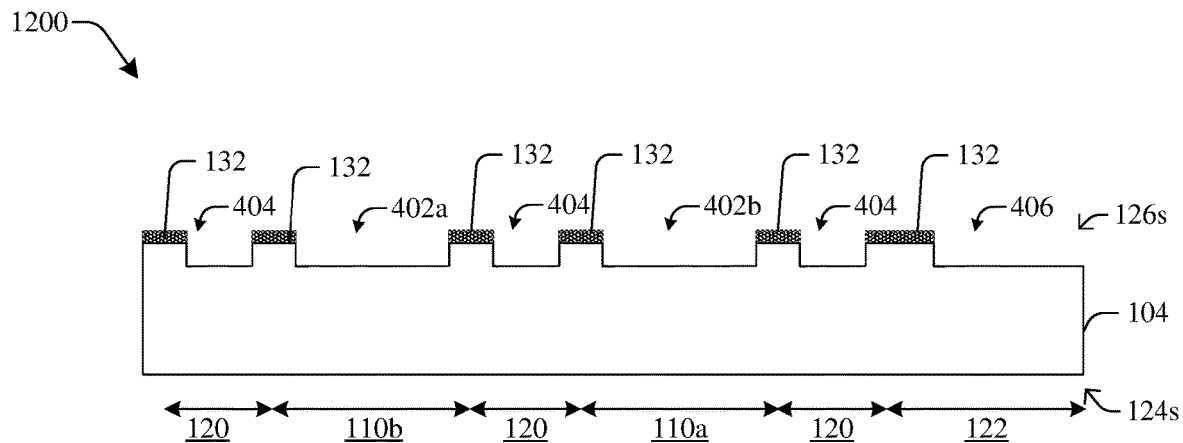
FIGS. 12-22 illustrate a series of cross-sectional views of some alternative embodiments of a MEMS package at various stages of manufacture.

As shown in FIG. 12, a cap substrate 104 is prepared. A first device region 110a and a second device region 110b are defined on the cap substrate 104. A scribe line region 120 may be defined surrounding the first device region 110a and the second device region 110b. A wafer edge region 122 may be defined at a boundary area of the cap substrate 104. In some embodiments, a bonding layer 132 is disposed on a front-side surface 126s of the cap substrate 104. The bonding layer 132 and the cap substrate 104 are patterned to form a first trench 402a in the first device region 110a, a second trench 402b in the second device region 110b, a scribe trench 404 in the scribe line region 120, and a wafer edge trench 406 in the wafer edge region 122. The first trench 402a, the second trench 402b, the scribe trench 404, and the wafer edge trench 406 are formed to have a substantially same depth vertically relative to a front-side surface 126s of the cap substrate 104. In various embodiments, the cap substrate 104 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith. As examples, the bonding layer 132 can be made of metals such as aluminum (Al), germanium (Ge), gold (Au), copper (Cu), Tin (Sn) or alloys.

Figure 13:
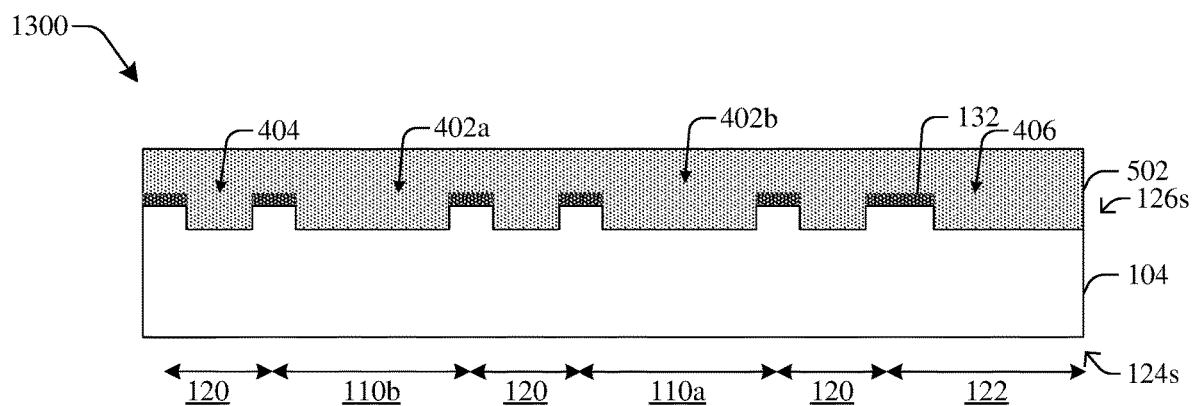

As shown in FIG. 13, a hard mask 502 is formed on the cap substrate 104. The hard mask 502 may be formed by deposition techniques and may comprise silicon dioxide, silicon nitride, other dielectric materials, or metal depending on applications. The hard mask 502 is formed to fill the first trench 402a, the second trench 402b, the scribe trench 404, and the wafer edge trench 406, and to extend over the bonding layer 132.

Figure 14:
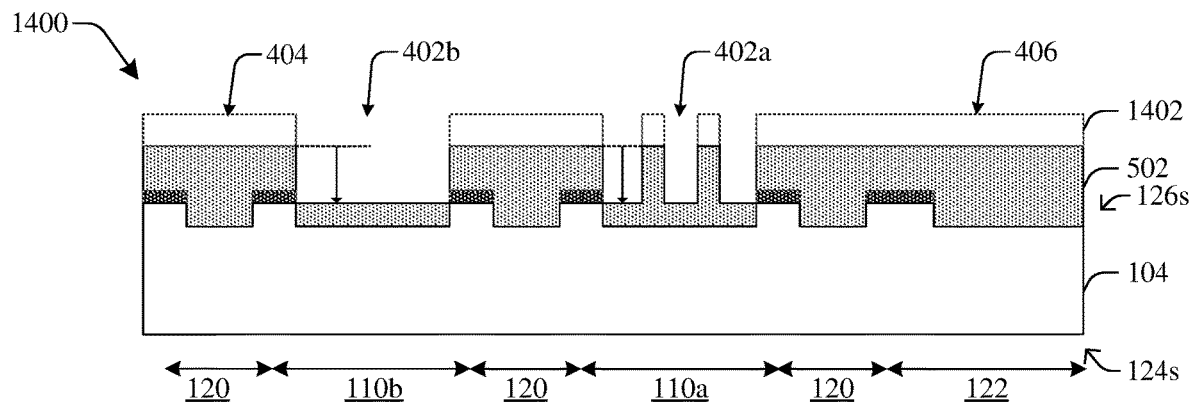

As shown in FIG. 14, a first patterning process is performed to the hard mask 502. As a result of the patterning, the hard mask 502 is recessed at the second trench 402b and a portion of the first trench 402a while a remainder of the hard mask 502 is covered by a first masking layer 1402 (e.g. a photoresist masking layer) and not altered. The patterning process produces and prepares a depth difference of the hard mask 502 for the portions within the first trench 402a. Thereby, a stopper can be subsequently formed self-aligned without a patterning process (referring to the stopper 119 formed in FIGS. 18-19 below). Comparing to an alternative method to form the stopper by a patterning process performed later in the fabrication process, a required aspect ratio of the patterning openings is reduced. The work piece has a less height variation at the stage shown in FIG. 14 than a later stage. Thereby, an optimized patterning result can be achieved.

Figure 15:
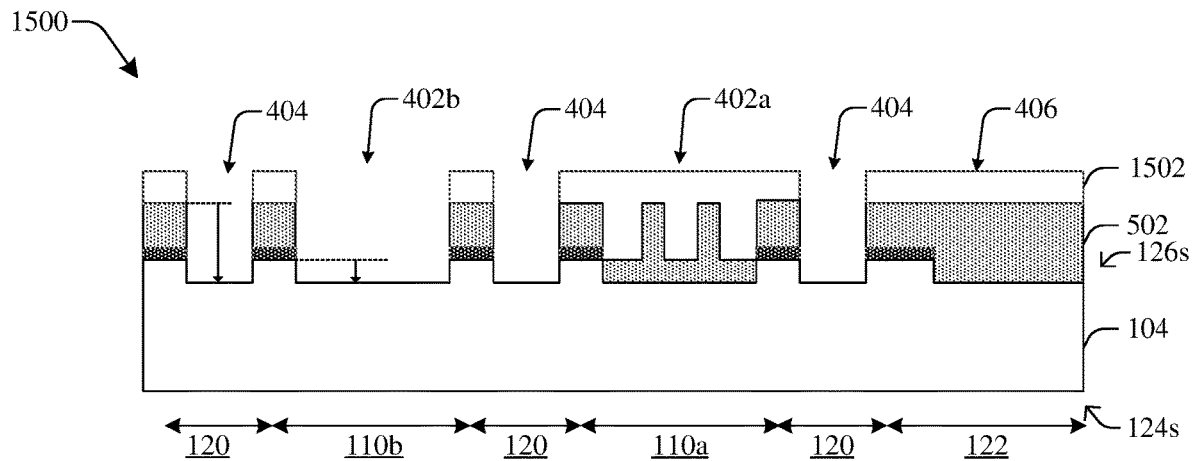

As shown in FIG. 15, a second patterning process is performed to the hard mask 502 with a second masking layer 1502 (e.g. a photoresist masking layer) in place. As a result of the patterning, the hard mask 502 within the second trench 402b and the scribe trench 404 are removed while a remainder of the hard mask 502 is not altered. As an alternative embodiment not shown in FIG. 14. The first masking layer 1402 can cover the second trench 402b, such that the hard mask 502 within the second trench 402b is not recessed in FIG. 14, and completely removed in FIG. 15. The patterning process exposes the second trench 402b and the scribe trench 404 while has the first trench 402a protected by the hard mask 502. Thereby, a depth difference can be subsequently formed by a series of etching processes. Comparing to an alternative method to form the first trench 402a and the second trench 402b with different depths by a patterning process performed later in the fabrication process, a required aspect ratio of the patterning openings is reduced. The work piece has a less height variation at the stage shown in FIG. 15 than a later stage. Thereby, an optimized patterning result can be achieved.

Figure 16:
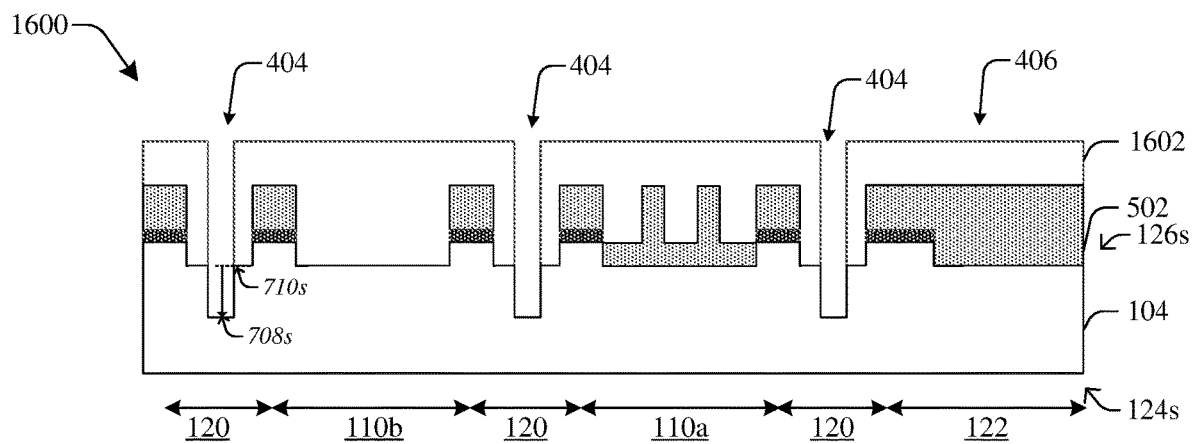

As shown in FIG. 16, a third masking pattern 1602 (e.g. a photoresist masking layer) is formed and patterned to expose a central portion 708s of the bottom surface of the scribe trench 404 while to cover a peripheral portion 710s of the bottom surface of the scribe trench 404. An etch is then performed to the scribe trench 404 to lower the central portion 708s of a bottom surface of the scribe trench 404 while not alter the peripheral portion 710s of the bottom surface of the scribe trench 404. Similarly, by lowering the bottom surface of the scribe trench 404 first followed by a blanket etch to further lower the scribe trench 404 and the first trench 402a together, the scribe trench 404 and the first trench 402a are formed having different depths. Comparing to an alternative method to etch the scribe trench 404 and the first trench 402a by separate patterning processes to target depths, a required aspect ratio of the patterning openings is reduced. Also, the work piece has a less height variation at the stage shown in FIG. 16 than a later stage. Thereby, an optimized patterning result can be achieved. The masking layers 1402, 1502, 1602 are formed on the hard mask 502 and then patterned by photolithography process(es). In some embodiments, the wafer edge trench 406 can be alternatively patterned similarly to what is shown and described in FIGS. 7-8.

Figure 17:
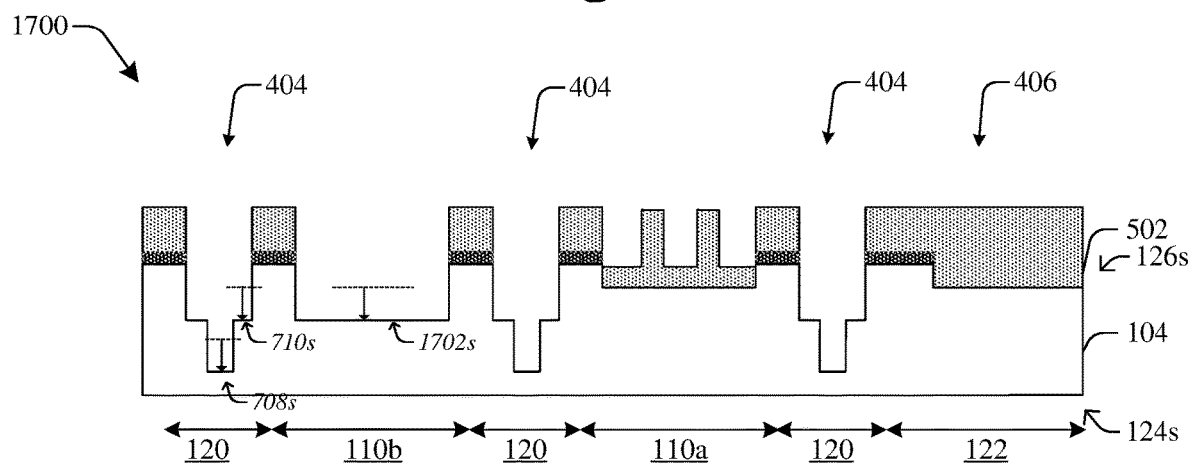

As shown in FIG. 17, the third masking layer 1602 (shown in FIG. 16) is removed, and a first blanket etch is performed to the cap substrate 104. The third masking pattern 1602 may be removed by a wet etching process followed by a wafer cleaning process. The first blanket etch may comprise an anisotropic (e.g. vertical) dry etch. As an etching result, lateral surfaces of the cap substrate 104 not covered by the hard mask 502 is recessed, which may include a bottom surface 1702s of the second trench 402b, the central portion 708s and the peripheral portion 710s of the bottom surface of the scribe trench 404. The etch back process may be a dry etch using an etchant that is highly selective to the material of the cap substrate 104 than the material of the hard mask 502.

Figure 18:
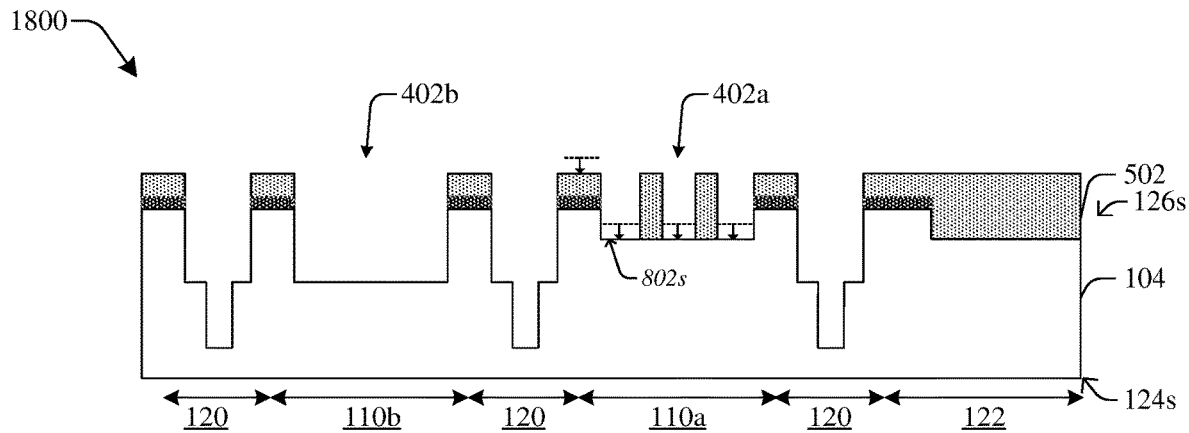

As shown in FIG. 18, a second blanket etch is performed to the hard mask 502, such that the hard mask 502 is vertically lowered, and a portion 802s of the bottom surface of the first trench 402a is exposed. The second blanket etch may comprise a dry etch using an etchant that is highly selective to the material of the hard mask 502 than the material of the cap substrate 104.

Figure 19:
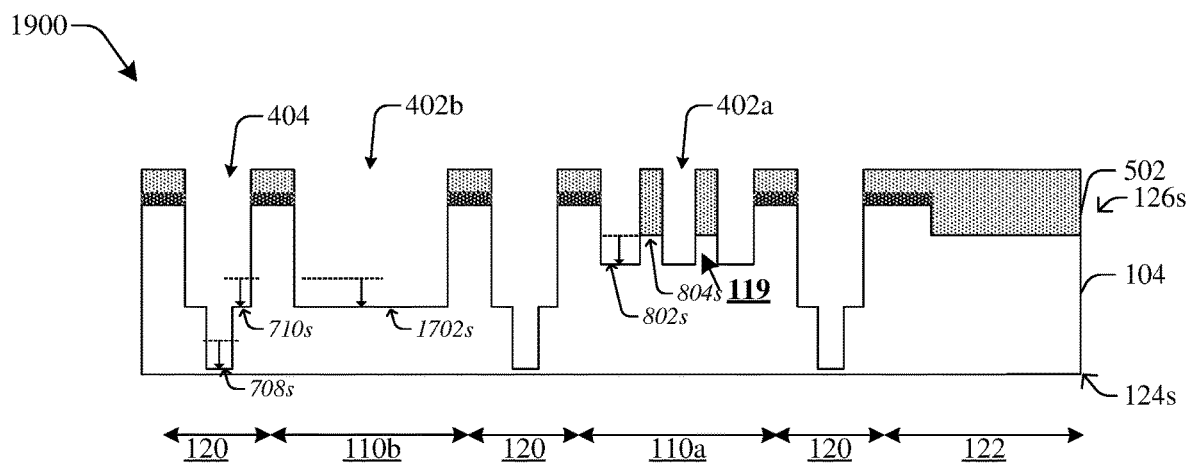

As shown in FIG. 19, a third blanket etch is performed to the cap substrate 104. The exposed portion 802s of the bottom surface of the first trench 402a is recessed together with the bottom surface 1702s of the second trench 402b, the central portion 708s and the peripheral portion 710s of the bottom surface of the scribe trench 404. A stopper 119 is formed within the first trench 402a with the exposed portion 802s of the bottom surface recessed from the covered portion 804s of the bottom surface of the first trench 402a. The second blanket dry etch may comprise a dry etch using an etchant that is highly selective to the material of the hard mask 502 than the material of the cap substrate 104.

Figure 20:
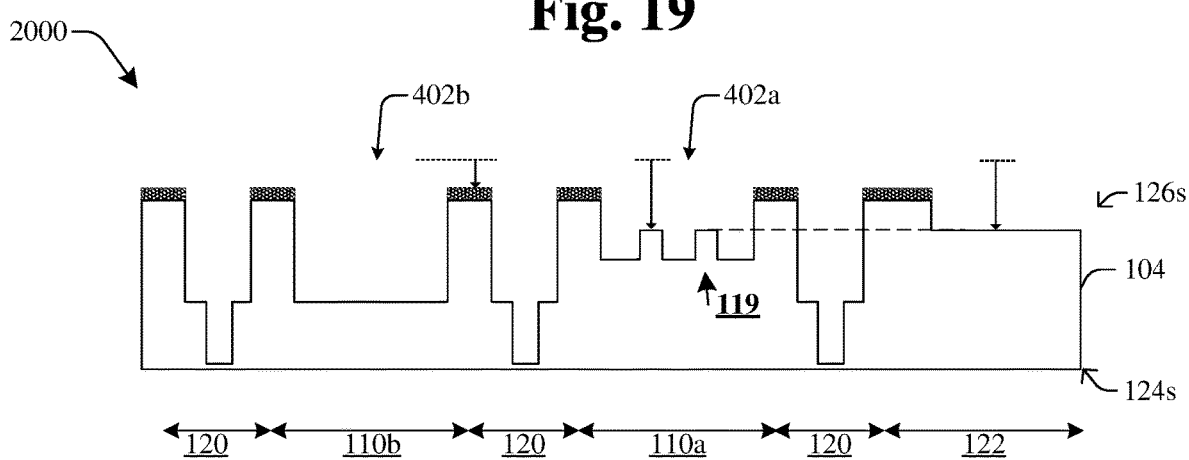

As shown in FIG. 20, a series of etching processes is performed to remove the hard mask 502 (shown in FIG. 19). The etching processes may comprise dry etching or wet etching and may selective to the hard mask 502.

Figure 21:
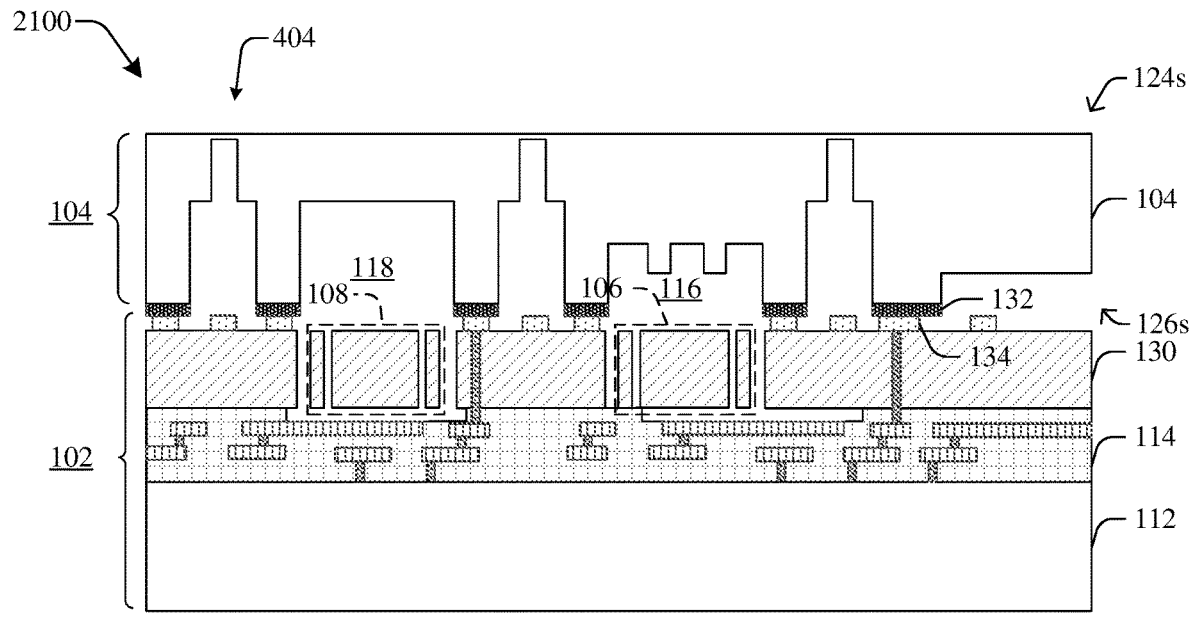

As shown in FIG. 21, the cap substrate 104 is flipped over and bonded to a device substrate 102. For example, the bonding layer 132 of the cap substrate 104 are bonded by a eutectic bonding process to the corresponding bonding elements 134 of the device substrate 102, such that the device substrate 102 and the cap substrate 104 are physically and electrically connected. Upon bonding, the first trench 402a (shown in FIG. 20) becomes part of the first cavity 116 enclosing a first MEMS device 106; and the second trench 402b becomes part of the second cavity 118 enclosing a second MEMS device 108. The device substrate 102 may be provided including a semiconductor substrate 112 with one or more active elements. A series of metallization planes and via interconnects are disposed within an IMD layer 114 formed over an upper surface of the semiconductor substrate 112. A MEMS substrate 130 comprising the first and second MEMS devices 106, 108 is bonded to the semiconductor substrate 112 through IMD layer 114 to form the device substrate 102. For example, the MEMS substrate 130 can be bonded to the IMD layer 114 by a fusion bonding process. In some embodiments, a fusion bonding is achieved between the IMD layer 114 comprising SiO$_2$ and the MEMS substrate 130 comprising Si. In some embodiments, the MEMS substrate 130 and/or the semiconductor substrate 112 is thinned down to reduce the thickness thereof after fusion bonding. In some embodiments, the eutectic bond includes a semiconductor-to-metal bonding between a semiconductor material and a metal material. In some embodiments, the semiconductor material includes at least one of Ge, Si, SiGe or another semiconductor material. In some embodiments, the metal material includes at least one of Al, Cu, Ti, Ta, Au, Ni, Sn, or another metal. Another example of eutectic bonding is a metal-to-metal bonding between two metal materials each including at least one of Al, Cu, Ti, Ta, Au, Ni, Sn, or another metal. The materials to be bonded are pressed against each other in an annealing process to form a eutectic phase of the materials. For example, a eutectic bonding between Ge and Al is formed at an annealing temperature in a range from 400° C. to 450° C.

Figure 22:
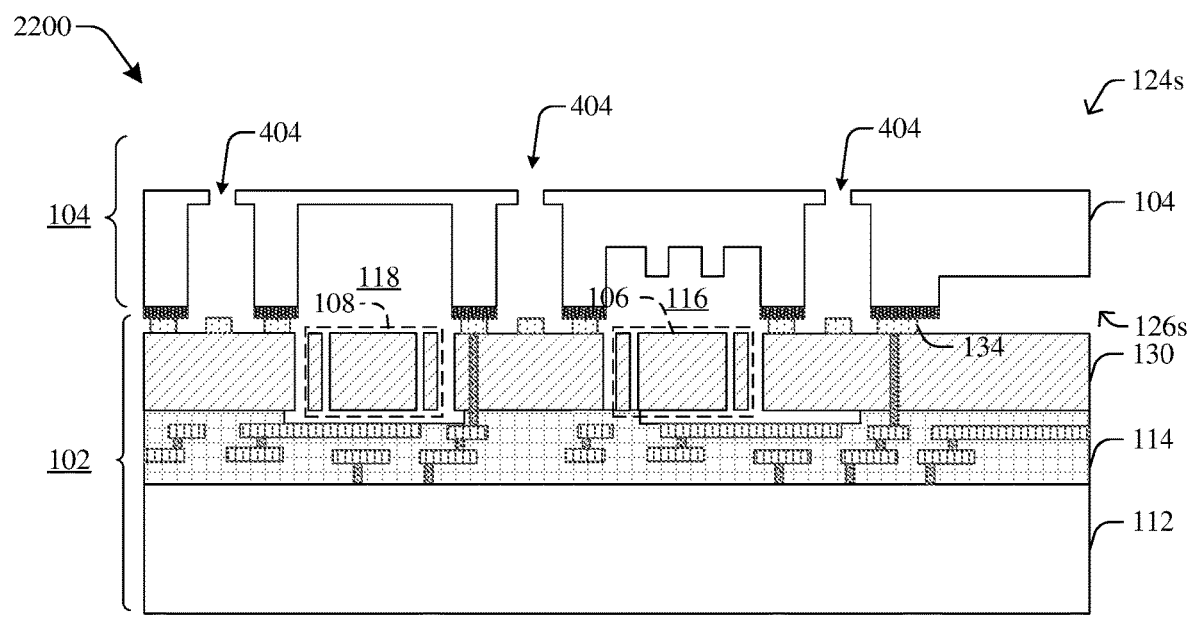

As shown in FIG. 22, in some embodiments, the cap substrate 104 is then thinned down to remove a partial thickness after being bonded to the device substrate 102. The scribe trench 404 may be exposed. The exposed scribe trench 404 may provide test points for the bonded wafer or other functions before dicing into singulated pieces.

Figure 23:
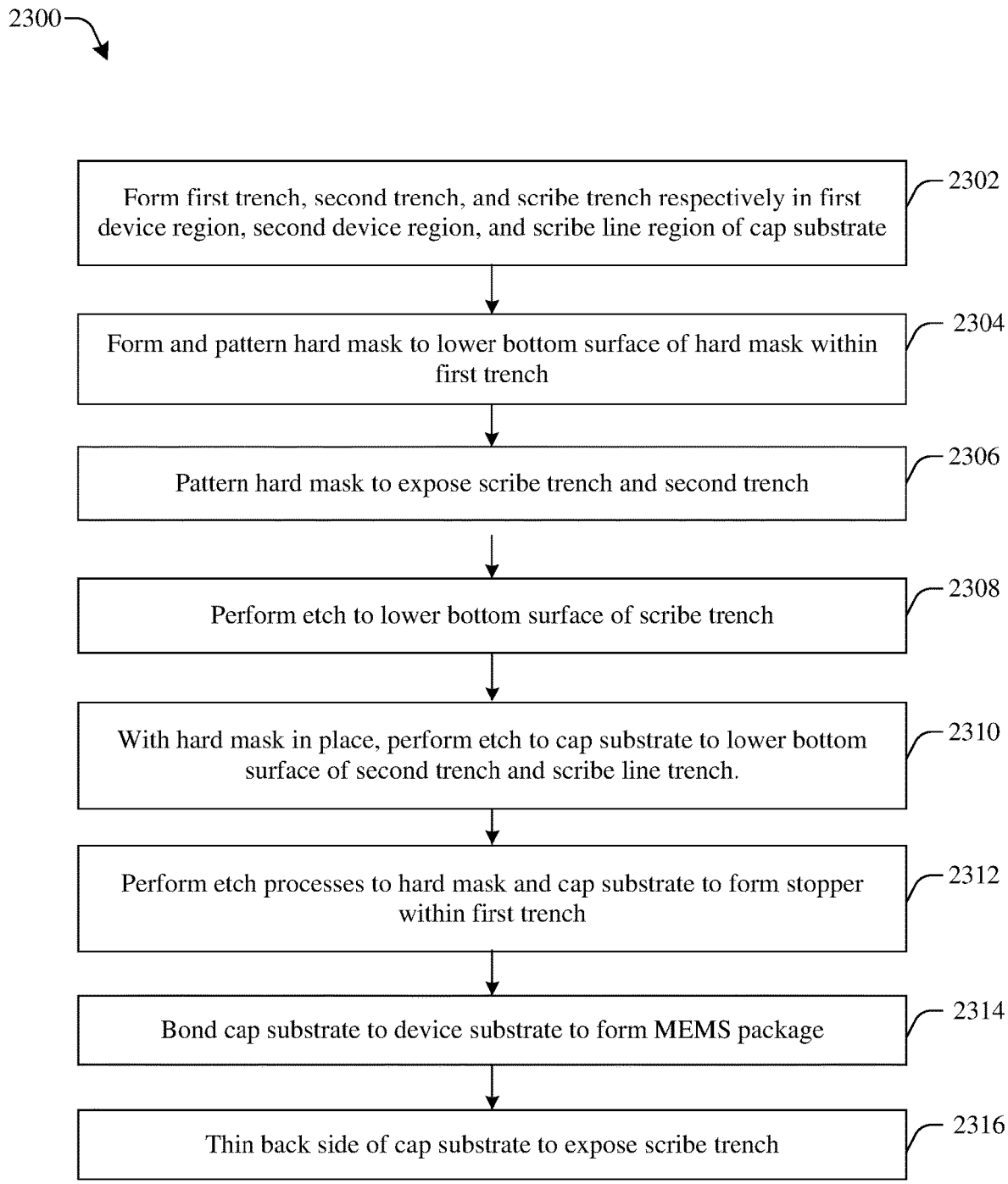
FIG. 23 illustrates a flow diagram of some alternative embodiments of a method for manufacturing a MEMS package.

FIG. 23 shows a flow diagram of a method 2300 for manufacturing a MEMS package according to some embodiments. The MEMS package comprises two MEMS devices with different cavity depths. Examples of the MEMS package are shown in FIG. 2.

While disclosed methods (e.g., methods 2300) are illustrated and described below as a series of acts or events, it will be appreciated that the illustrated ordering of such acts or events is not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases. Although the method 2300 is described in relation to FIGS. 12-22, it will be appreciated that the method 2300 is not limited to the structures disclosed in FIGS. 12-22, but instead may stand alone independent of the structures disclosed in FIGS. 12-22.

At action 2302, a first trench and a second trench are respectively formed in a first device region and a second device region, and a scribe trench is formed in scribe line region of a cap substrate. FIG. 12 shows a cross-sectional view corresponding to action 2302 according to some embodiments.

At action 2304, a hard mask is formed and patterned such that a bottom surface of the hard mask is recessed at the second trench and a portion of the first trench while a remainder of the hard mask is covered by a first masking layer. FIGS. 13-14 show cross-sectional views corresponding to action 2304 according to some embodiments.

At action 2306, a second patterning process is performed to the hard mask to be removed from the second trench and the scribe trench. FIG. 15 shows a cross-sectional view corresponding to action 2306 according to some embodiments.

At action 2308, an etch is performed to lower a bottom surface of the scribe trench. FIG. 16 shows a cross-sectional view corresponding to action 2308 according to some embodiments.

At action 2310, with the hard mask in place, a blanket etch is performed to the cap substrate to lower bottom surface of the second trench and the scribe trench. The first trench is covered and protected by the hard mask. FIG. 17 shows a cross-sectional view corresponding to action 2310 according to some embodiments.

At action 2312, perform a series of etching processes to the hard mask and the cap substrate to form a stopper within the first trench. The hard mask is then removed. FIGS. 18-20 show cross-sectional views corresponding to action 2312 according to some embodiments.

At action 2314, the cap substrate is bonded to a device substrate to enclose a first MEMS device and a second MEMS device with different cavity depths and form the MEMS package. FIG. 21 shows a cross-sectional view corresponding to action 2314 according to some embodiments.

At action 2316, the back-side of cap substrate is thinned to expose the scribe trench. The exposed scribe trench may provide test points for the bonded wafer or other functions before dicing into singulated pieces. FIG. 22 shows a cross-sectional view corresponding to action 2316 according to some embodiments.

Thus, as can be appreciated from above, the present disclosure relates to a MEMS package and associated methods. In some embodiments, a first trench in a first device region and a scribe trench in a scribe line region are formed at a front side of a cap substrate. Then, a hard mask is formed and patterned over the cap substrate. Then, with the hard mask in place, an etch is performed to the cap substrate such that an uncovered portion of a bottom surface of the first trench is recessed while a covered portion of the bottom surface of the first trench is non-altered to form a stopper within the first trench. Then, the front side of the cap substrate is bonded to a device substrate, enclosing the first trench over a first MEMS device. Thus, by forming a first trench and then forming and patterning a hard mask within the first trench to prepare for a further etched back (e.g. to form a stopper), different trench depths are formed without applying a photoresist masking layer within deep trenches. Thereby, fabrication quality is improved.

In some embodiments, the present disclosure relates to a microelectromechanical systems (MEMS) package. A cap substrate is bonded to a device substrate. The cap substrate comprises a cap substrate bonded to a device substrate. The cap substrate comprises a MEMS trench, a scribe trench, and an edge trench respectively recessed from at a front-side surface of the cap substrate. A stopper is disposed within the MEMS trench and raised from a bottom surface of the MEMS trench.

In other embodiments, the present disclosure relates to a microelectromechanical systems (MEMS) package. A device substrate comprises a first MEMS device and a second MEMS device. A cap substrate is bonded to the device substrate. The cap substrate comprises a first trench overlying the first MEMS device, a second trench overlying the second MEMS device, and a scribe trench disposed in a scribe line region and recessed from a front-side surface of the cap substrate. The first trench and the second trench have different depths. A stopper is raised from a bottom surface of the first trench to a position vertically lower than the front-side surface of the cap substrate.

In yet other embodiments, the present disclosure relates to a microelectromechanical systems (MEMS) package. A device substrate comprises a first MEMS device and a second MEMS device. A cap substrate is bonded to the device substrate. The cap substrate encloses a first cavity overlying the first MEMS device and a second cavity overlying the second MEMS device. The first cavity has a first depth with respect to a front-side surface of the cap substrate smaller than a second depth of the second cavity with respect to the front-side surface of the cap substrate. A stopper is raised from a bottom surface of the first cavity to a position within the first cavity.

The foregoing outlines feature of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure and that they may make various changes, substitutions, and alterations herein without departing from the spirit and scope of the present disclosure.

The invention claimed is:

1. A microelectromechanical systems (MEMS) package, comprising:
   a cap substrate bonded to a device substrate, the cap substrate comprising a MEMS trench, a scribe trench, and an edge trench respectively recessed from at a front-side surface of the cap substrate; and
   a stopper disposed within the MEMS trench and raised from a bottom surface of the MEMS trench;
   wherein a vertical distance of a first lateral surface of the edge trench with respect to the front-side surface of the cap substrate is different from a MEMS depth of the MEMS trench.

2. The MEMS package of claim 1, wherein the stopper has a stopper height same with the vertical distance between the first lateral surface of the edge trench and the front-side surface of the cap substrate.

3. The MEMS package of claim 1, wherein the vertical distance of the first lateral surface of the edge trench with respect to the front-side surface of the cap substrate is smaller than the MEMS depth of the MEMS trench.

4. The MEMS package of claim 1, wherein a vertical distance of a second lateral surface of the edge trench with respect to the front-side surface of the cap substrate is same with a scribe depth of the scribe trench.

5. The MEMS package of claim 4, wherein a vertical distance of a lateral surface of the scribe trench with respect to the front-side surface of the cap substrate is same with the MEMS depth of the MEMS trench.

6. The MEMS package of claim 1, wherein the MEMS depth of the MEMS trench is same with a vertical distance of a second lateral surface of the edge trench with respect to the front-side surface of the cap substrate and a vertical distance of a lateral surface of the scribe trench with respect to the front-side surface of the cap substrate.

7. The MEMS package of claim 6, wherein the edge trench has a depth deeper than that of the MEMS trench.

8. A microelectromechanical systems (MEMS) package, comprising:
   a device substrate comprising a first MEMS device and a second MEMS device;
   a cap substrate bonded to the device substrate, the cap substrate comprising a first trench overlying the first MEMS device, a second trench overlying the second MEMS device, and a scribe trench disposed in a scribe line region and recessed from a front-side surface of the cap substrate, the first trench and the second trench having different depths; and
   a stopper raised from a bottom surface of the first trench to a position vertically lower than the front-side surface of the cap substrate.

9. The MEMS package of claim 8, wherein the first trench has a first depth with respect to the front-side surface of the cap substrate smaller than a second depth of the second trench with respect to the front-side surface of the cap substrate.

10. The MEMS package of claim 9, wherein the scribe trench has a third depth same with the second depth of the second trench.

11. The MEMS package of claim 8, wherein the scribe trench is disposed between the first trench and the second trench.

12. The MEMS package of claim 8, further comprising an edge trench in a boundary region of the cap substrate.

13. The MEMS package of claim 12, wherein the edge trench has a lateral surface having a vertical distance with respect to the front-side surface of the cap substrate that is equal to a stopper depth of the stopper.

14. The MEMS package of claim 12, wherein the edge trench has a lateral surface having a vertical distance with respect to the front-side surface of the cap substrate that is equal to the depth of the first trench.

15. The MEMS package of claim 12, wherein the edge trench has a lateral surface having a vertical distance with respect to the front-side surface of the cap substrate that is equal to a scribe depth of the scribe trench.

16. The MEMS package of claim 8, wherein the device substrate and the cap substrate are bonded by a pair of bonding elements through a eutectic bonding.

17. The MEMS package of claim 16, wherein the pair of bonding elements is disposed between the first MEMS device and the second MEMS device.

18. A microelectromechanical systems (MEMS) package, comprising:
   a device substrate comprising a first MEMS device and a second MEMS device; and
   a cap substrate bonded to the device substrate, the cap substrate enclosing a first cavity overlying the first MEMS device and a second cavity overlying the second MEMS device; wherein the first cavity has a first depth with respect to a front-side surface of the cap substrate smaller than a second depth of the second cavity with respect to the front-side surface of the cap substrate; and
   a stopper raised from a bottom surface of the first cavity to a position within the first cavity.

19. The MEMS package of claim 18, further comprising a scribe trench disposed within the cap substrate, wherein the scribe trench has a third depth same with the second depth of the second cavity.

20. The MEMS package of claim 18, wherein the stopper has a top surface vertically lower than the front-side surface of the cap substrate.

* * * * *